United States Patent [19]

Watanabe et al.

[11] Patent Number: 4,835,445
[45] Date of Patent: May 30, 1989

[54] FLUORESCENT DISPLAY DEVICE

[75] Inventors: Teruo Watanabe; Tatsuo Yamaura, both of Mobara, Japan

[73] Assignee: Futaba Denshi Kogho K.K., Mobara, Japan

[21] Appl. No.: 177,949

[22] Filed: Apr. 5, 1988

[30] Foreign Application Priority Data

Apr. 6, 1987 [JP] Japan .................. 62-50987

[51] Int. Cl.$^4$ .......................... H01J 1/62; H01J 63/04
[52] U.S. Cl. ...................................... 315/58; 313/497; 361/399; 361/400; 361/402
[58] Field of Search ............... 313/494, 495, 497, 510, 313/509–513; 340/815.2; 361/399, 400, 402, 387; 315/58

[56] References Cited

U.S. PATENT DOCUMENTS 4,639,830  1/1987  Fukuoka ........................ 361/402
4,774,434  9/1988  Bennion ......................... 313/511

FOREIGN PATENT DOCUMENTS 61-22946   1/1986  Japan .
61-55847   3/1986  Japan .
62-50984  10/1987  Japan .

Primary Examiner—David K. Moore
Assistant Examiner—Brian S. Palladino
Attorney, Agent, or Firm—Oblon, Fisher, Spivak, McClelland & Maier

[57] ABSTRACT

A fluorescent display device capable of forming a die bond layer into a desired and uniform thickness, resulting in minimizing adverse affection of thermal stress occurring during the manufacturing and accurately accomplishing wire bonding operation to lead to an improvement in its reliability. Also, a method for manufacturing the device. The fluorescent display device is so constructed that an insulating bank of a frame-like shape is provided between a die bonding pad and bonding pads and a die bond layer is arranged in a space defined at an inside of the bank to adhesively bond an IC chip to a substrate.

6 Claims, 2 Drawing Sheets

FIG. 4(a)   FIG. 4(b)

FLUORESCENT DISPLAY DEVICE

BACKGROUND OF THE INVENTION

1. Field of the Invention

This invention relates to a fluorescent display device wherein a display section provided with phosphor layers and a circuit section provided with a semiconductor chip are arranged on the same substrate in a vacuum envelope, and more particularly to a fluorescent display device which is improved in a structure of the circuit section and a die bond layer to improve reliability in its operation and a method for manufacturing the same.

2. Description of the Prior Art

The prior art will be described with reference to FIGS. 3 and 4.

A conventional fluorescent display device of the type that a display section 1 provided with phosphor layers and a circuit section 3 provided with an IC chip are arranged on the same substrate 4 in a vacuum envelope (not shown) is shown in FIG. 3. It is generally called a chip-in-glass type fluorescent display device. In the device, the circuit section 3 provided on the substrate 4 is constructed in such a manner as shown in FIG. 4A and 4B. More particularly, as shown in FIG. 4B, a die bonding pad 5 made of a metal material such as Al or the like is provided on an upper surface of the substrate 4 and entirely covered with a die bond layer 6 formed of a conductive adhesive. On the die bonding pad 5 is fixed an IC chip 2 through the die bond layer 6. From the die bonding pad 5 is led out an earth wire 5a to keep a silicon substrate of the IC chip 2 at ground potential. Around the die bonding pad 5 are a plurality of bonding pads 7 so as not to be contacted with the die bond layer 6. The bonding pads 7 each are connected through a wire conductor 8 formed of Al, Ag or the like to an input-output terminal of the IC chip 2. From a side of each of the bonding pads 7 opposite to its side facing the die bonding pad 5 is led out a wiring 7a onto the substrate 4. The wirings 7a each are guided so as to avoid a region between the die bonding pad 5 and the bonding pads 7 for connection to the display section 1, lead terminals and the like. Manufacturing of the chip-in-glass type fluorescent display device requires to heat the envelope to 400°-500° C. during hermetic sealing of the envelope. The heating causes the IC chip 2 arranged in the envelope to be subjected to a high temperature. Accordingly, it is necessary to determine a thickness of the die bond layer 6 for bonding the IC chip 2 and the substrate 4 together therethrough in view of not only its bonding strength but thermal stress occurring in the die bond layer 6 due to the heating. This leads to an increase in the thickness to a degree sufficient to cause the die bond layer 6 to absorb the thermal stress. Concurrently, it is required to render the thickness substantially uniform.

In general, the circuit section 3 of the chip-in-glass type fluorescent display device is made by putting the die bond layer 6 of a paste-like state on the die bonding pad 5, positioning the IC chip 2 on the die bond layer 6 while pressing it, and then fixing the IC chip on the die bond layer 6 by baking. Unfortunately, during formation of the circuit section 3, the pasty die bond layer 6 not only outwardly expands by gravity but is forced out from between the IC chip 2 and the die bonding pad 5 because the IC chip 2 is downwardly forced against the die bond layer 6. Thus, the prior art fails to form the die bond layer 6 of a large and uniform thickness.

A polyimide paste has been conventionally used as a paste for such a die bond layer as described above, as disclosed in Japanese Utility Model Application Laying-Open Publication No. 24946/1986. However, the polyimide paste starts thermal decomposition at a temperature of about 430° C., accordingly, use of the polyimide paste for a fluorescent display device causes decomposition of the paste to produce various kinds of destructive gas because it is exposed to a high temperature of 400° to 500° C. for hermetic sealing of a vacuum envelope, resulting in deteriorating characteristics of the fluorescent display device. Also, exposing of the die bond layer to the high temperature causes weakening of its bonding strength.

In view of the foregoing, a heat-resistant inorganic paste was proposed for the die bond layer, as disclosed in Japanese Patent Application Laying-Open Publication No. 55847/1986. The proposed inorganic die bond paste contains 80-85% by weight of low-melting frit glass mainly consisting of powdered Ag and PbO and an organic binder. Use of the low-melting frit glass for the fluorescent display device exhibits an advantage. More particularly, the low-melting frit glass exhibits fluidity to fully wet the IC chip and anode substrate when it is heated to a sealing temperature of 400°-450° C., as is supposed from the fact that it is used as a sealing material; whereas when it is cooled, it is vitrificated to cause the die bond layer to be in a bulky state, so that it may carry out firm bonding between the IC chip and the anode substrate. Also, when it is heated to a temperature of 300° C. or more, the organic binder contained therein substantially vanishes by combustion and/or volatilization. Accordingly, the above-noted problem encountered with the organic paste is substantially solved.

In general, the anode substrate 4 is made of glass which has a thermal expansion coefficient of about $90 \times 10^{-7}/°C.$, whereas a base or substrate of the IC chip 2 is formed of silicon which has a thermal expansion coefficient of about $42 \times 10^{-7}/°C.$ Thus, it will be noted that there is a significant difference in the coefficient between both. This causes surfaces of the anode substrate 4 and IC chip 2 bonded together to crack by shrinkage stress due to curing of the die bond layer as both are cooled after firm bonding therebetween. The larger a size of the chip is, the more cracking is.

The fluorescent display device is gradually complicated in its display pattern with advance of its miniaturization, to thereby lead to an increase in the number of anode segments in the display section 1. This causes the number of lead wires and wirings for driving the anode segments of the display section 1 to be concurrently increased. The wirings 7a are conventionally led out directly to an exterior of the envelope, so that arrangement of them on the substrate in the envelope may be relatively readily carried out.

However, in the chip-in-glass type fluorescent display device it is required to connect the wirings 7a to the IC chip 2 in the envelope and connect the IC chip and lead wires together by means of the wirings, resulting in the wirings being required to be arranged at high density on the substrate.

Also, the circuit section 3 of the conventional chip-in-glass type fluorescent display device must be formed while considering the above-described overflowing of the pasty die bond layer 6 from between the IC chip 2 and the die bonding pad 5. This renders arrangement of the wirings 7a between the die bonding pad 5 and the bonding pad 7 substantially impossible, so that density of arrangement of the wirings on a portion of the substrate 4 adjacent to the IC chip 2 is further increased, therefore, manufacturing of the fluorescent display device is highly difficult and troublesome.

SUMMARY OF THE INVENTION

The present invention has been made in view of the foregoing disadvantages of the prior art.

Accordingly, it is an object of the present invention to provide a fluorescent display device which is capable of exhibiting high reliability in its operation.

It is another object of the present invention to provide a fluorescent display device which is capable of minimizing adverse affection by thermal stress occurring in the manufacturing.

It is a further object of the present invention to provide a fluorescent display device which is capable of accomplishing wire bonding with high accuracy.

It is still another object of the present invention to provide a fluorescent display device which is capable of arranging wirings at high density on a substrate.

It is yet another object of the present invention to provide a method for manufacturing a fluorescent display device which is capable of providing a fluorescent display device exhibiting high reliability in its operation.

In accordance with one aspect of the present invention, a fluorescent display device is provided. The device includes a display section for carrying out luminous display and a circuit section including a semiconductor chip for driving the display section. The display section includes an anode substrate constituting a part of a vacuum envelope in which a high vacuum atmosphere is formed and an anode depositedly formed on the anode substrate. The circuit section comprises a die bonding pad arranged on the anode substrate, bonding pads arranged on a portion of the anode substrate outside the die bonding pad, an insulating bank provided between a periphery of the die bonding pad and the bonding pads, a conductive die bond layer provided in a space defined at an inside of the bank and fine metal wires for connecting the semiconductor chip and the bonding pads. The semiconductor chip is arranged on an end of the anode substrate and fixed on the substrate through the die bond layer.

Also, in accordance with another aspect of the present invention, a method for manufacturing a fluorescent display device is provided. In the method, film patterns including a wiring pattern, an anode conductor die bonding pad, bonding pads and the like are formed of a metal film on a substrate and then an insulating bank is formed on the substrate so as to surround the die bonding pad. Subsequently, a die bond paste consisting of conductive particles and a vehicle containing an organometallic material is applied to a space defined at an inside of said bank and a semiconductor chip is positioned on the die bond paste. Thereafter, the anode substrate is placed in a baking oven of an oxidizing atmosphere to subject the die bond paste to thermal curing and change the organometallic material to metal oxide, to thereby cause the metal oxide and conductive particles to form a matrix structure.

In the present invention, as described above, the insulating bank is provided between the outer periphery of the die bonding pad and the bonding pads, so that a predetermined amount of conductive adhesive may be applied to the space at the inside of the bank to form the die bond layer into a desired thickness sufficient to absorb thermal stress without a variation in thickness, resulting in an improvement in reliability of operation of the fluorescent display device.

Also, the bank dams up the die bond layer, so that wirings may be arranged between the die bonding pad and the bonding pads. Also, the wirings are insulatedly covered with the insulating bank. Thus, the wirings are formed at high density and exhibits good reliability.

Also, the die bond layer is formed by baking a paste consisting of conductive particles and a vehicle containing an organometallic material in an oxidizing atmosphere. Accordingly, the organometallic material is decomposed into metal oxide and the remaining organic component vanishes by combustion and/or volatilization, so that the die bond layer may be formed into a structure wherein pores are distributed in the form of a threedimensional network. Thus, the die bond layer is microscopically porous, wherein a film of the metal oxide supports Ag particles in the form of a three-dimensional network. Accordingly, the die bond layer can positively absorb thermal stress due to a difference in thermal expansion coefficient between the substrate and the semiconductor chip. The metal oxide formed by subjecting the organometallic material to baking in an oxidizing atmosphere exhibits excellent heat resistance and good affinity for glass because it is also metal oxide.

BRIEF DESCRIPTION OF THE DRAWINGS

These and other objects and many of the attendant advantages of the present invention will be readily appreciated as the same becomes better understood by reference to the following detailed description when considered in connection with the accompanying drawings in which like reference numerals designate like or parts throughout; wherein:

FIG. 4A is a sectional view showing a circuit section of the fluorescent display device of FIG. 3; and FIG. 4B is a fragmentary plan view showing a pattern of arrangement of a die bonding pad and the like in the circuit section shown in FIG. 4A.

DETAILED DESCRIPTION OF THE PREFERRED EMBODIMENT

Now, a fluorescent display device and a method for manufacturing the same according to the present invention will be described hereinafter with reference to FIGS. 1 and 2.

Figure 1:
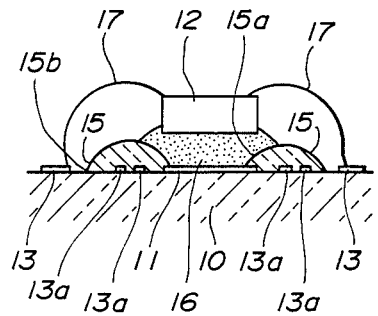
FIG. 1A is a fragmentary sectional view showing an essential part of an embodiment of a fluorescent display device according to the present invention.
FIG. 1B is a schematic view showing a pattern of arrangement of a die bonding pad and the like in the embodiment shown in FIG. 1A.
Figure 1:
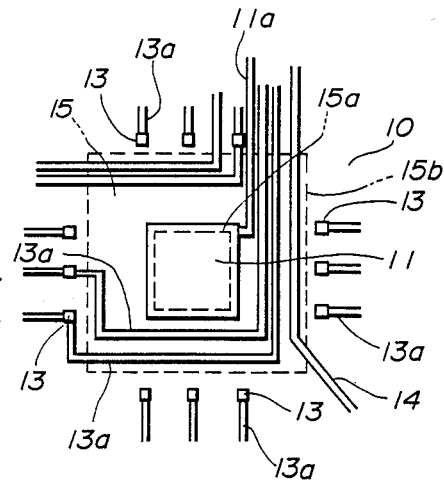
Figure 2:
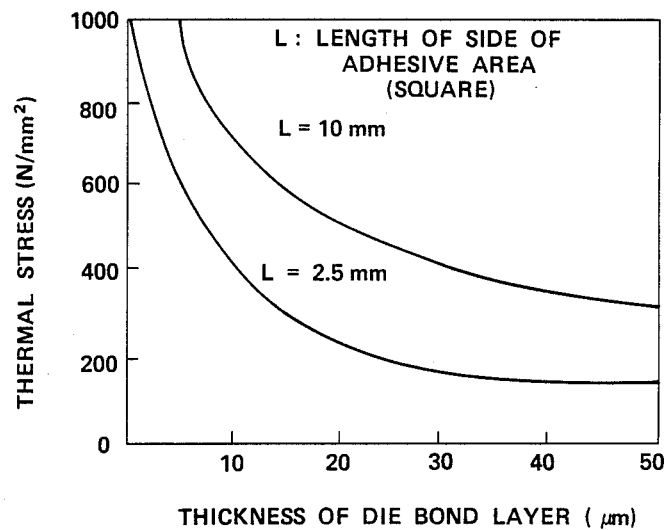
FIG. 2 is a graphical representation showing a relationship between a thickness of a die bond layer and thermal stress occurring in the die bond layer.
Figure 3:
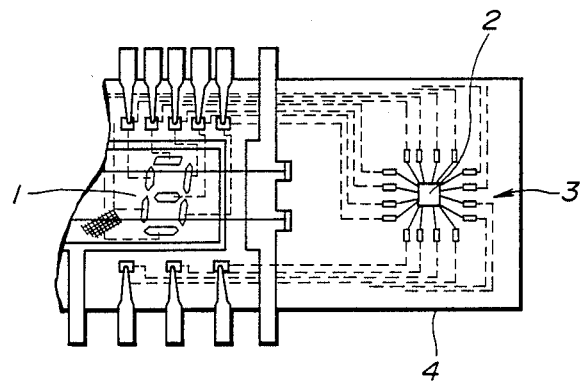
FIG. 3 is a partially cutaway plan view showing a conventional chip-in-glass type fluorescent display device.
Figure 3:
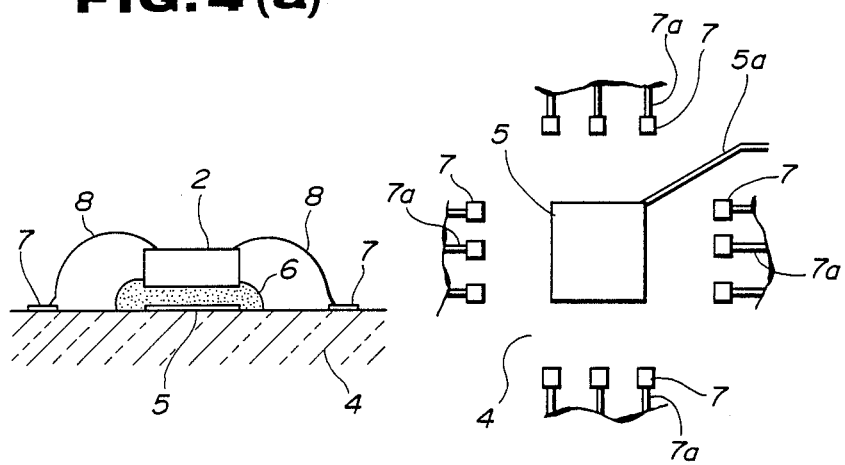

FIG. 1 shows a circuit section in a chip-in-glass type fluorescent display device according to the present invention. The circuit section includes a substrate 10 which is provided on an upper surface thereof with a die bonding pad 11 made of a metal material such as Al or the like. From the die bonding pad 11 is led out an earth wire 11a through which potential of an IC chip 12 electrically connected to the die bonding pad 11 as described above is dropped to a level of ground potential. On a portion of the substrate 10 around the die bonding pad 11 are arranged a plurality of bonding pads 13. From each of the bonding pads 13 are led out wirings 13a, which are then connected to anode segments of a display section and an internal end of each of lead terminals (not shown). A part of the wirings 13a is arranged on a portion or region of the substrate 10 between the die bonding pad 11 and the bonding pads 13. Also, a part of another wiring 14 is arranged on the region of the substrate 10. Between an outer periphery of the die bonding pad 11 and the bonding pads 13 is provided an insulating bank 15 of a semicylindrical shape in section which is arranged in a rectangular frame-like shape. In the illustrated embodiment, the insulating bank 15 is formed continuously around the periphery of the die bonding pad 11 in such a manner that an inner periphery 15a of the bank 15 contacts with the outer periphery of the die bonding pad 11 and its outer periphery 15b does not contact with the bonding pads 13. A part of the wirings 13a and 14 arranged on the region of the substrate 10 between the die bonding pad 11 and bonding pads 13 is insulatedly covered with the bank 15. An area of the die bonding pad 11 exposed from the inner periphery 15a of the bank 15 and a height of the bank are suitably determined depending on the amount of a conductive adhesive poured to a space defined at an inside of the bank 15 in such a manner as described below. The insulating bank 15 may be formed by printing an insulating paste containing crystalline low-melting frit glass into a predetermined thickness on the substrate by means of a screen frame and then baking it.

Then, a conductive die bond layer 16 of a predetermined thickness is provided in the space defined at the inside of the bank 15 and the IC chip 12 is mounted on the die bond layer 16. The IC chip 12 is adhesively fixed with respect to the die bonding pad 11 through the die bond layer 16, to thereby be electrically connected to the die bonding pad 11.

The die bond layer 16 is made of a mixture of fine particles of a conductive material and a vehicle containing an organometallic material. The fine particles may include fine metal materials having a particle diameter of 0.1–50 μm such as Ag particles, Au particles, Cu particles and the like. In particular, flake-like Ag particles are preferably used.

The organometallic materials include organic compounds containing metal atoms such as Ti, Al, Si, In, Zr and the like. The organotitanium compounds suitable for use in the present invention include, for example, tetraisopropoxy titanium (TPT), tetra-n-butoxy titanium (TBT), tetrakis-2-ethylhexoxy titanium (TOT), tetrastearoxy titanium (TST), diisopropoxy-bisacetylacetonato titanium (TAA), di-n-butoxy-bis-triethanolaminato titanium (TAT), tetrakis-2-ethylhexanediolato titanium (TOG), dihydroxy-bis-lactone titanium (TLA) and the like.

In general, the organotitanium compounds are essentially in the form of a liquid or soluble in a solvent, wettable and pasted. Also, it is known that the organotitanium compounds each form titanium oxide when it is thermally decomposed. Thus, it will be noted that they act as a binder for fixing, on the substrate, Ag particles which serve as a functional material in the paste.

The vehicle is a viscous liquid obtained by dissolving an organic binder in an organic solvent which is a volatile component. The organic solvents may include hydrocarbon, ketone, ether, alcohol and the like.

More specifically, the organic solvents include, for example, tridecanol, benzyl alcohol, terpineol, dodecanol, butylcarbinol, benzyl acetate, trimethylnonanone, n-hexylether and the like. The organic solvents may be selectively used for adjusting a vaporization rate of the vehicle. For this purpose, they may be used in the form of their mixture. The organic binder is added in order to stably distribute the fine conductive particles in the die bond layer and provide the paste with fluidity, accordingly, the amount of the binder added is varied depending on a mesh of a screen used for screen printing, a thickness of the die bond layer 16 to be formed, and the like. Cellulose derivatives such as ethyl cellulose and the like and polymeric compounds such as polyvinyl acetate and the like may be used as the binder. The organic binder has a property of being thermally decomposed when it is baked.

Examples of formulation for the die bond paste are as follows:

Formulation 1

Organotitanium compound (TOG): 25 g
Fine conductive particles (Fine Ag particles): 75 g
Vehicle (Ethyl cellulose): Suitable Formulation 2

Organotitanium compound (TOG): 30 g
Fine conductive particles (Fine Ag particles): 70 g
Vehicle (Tridecanol, terpineol): Suitable The limitation of a content of chlorine as an impurity in the organotitanium compound to 30 ppm or below provides a fluorescent display device with satisfactory characteristics.

The respective components are weighed according to each of the above formulations and fully mixed together to prepare a die bond paste. The so-prepared die bond paste is applied onto a rear surface of at least one of a ground electrode and the IC chip 12 by stamping, dispensing, printing or the like. Then, the IC chip 12 is precisely positioned with respect to the substrate 10. Application of the die bond paste and positioning of the IC chip 6 with respect to the substrate 10 may be automatically carried out using a machine called a die bonder.

Then, the anode substrate 10 on which the IC chip 12 is put is heated in a baking oven of an oxidizing atmosphere kept at a peak temperature of 400°–500° C. for the purpose of forming or curing the die bond layer 16 to fix the IC chip 12 on the substrate 10. During the heating, the organotitanium compound contained in the die bond paste is subjected to thermal decomposition, resulting in being changed to titanium oxide. However, a content of Ti in the organotitanium compound is as low as about 10% and the balance is an organic component, therefore, the thermally decomposed organotitanium compound is substantially volatilized except the titanium oxide. Likewise, the vehicle substantially vanishes by oxidative decomposition and/or volatilization. Thus, the die bond layer 16 obtained is formed into a porous matrix structure wherein fine continuous pores are distributed in the form of a three-dimensional network. This results in the die bond layer 16 through which the IC chip 12 and substrate 10 are bonded together being a porous composite material constituted by flexible Ag particles and films and/or particles of titanium oxide present among the Ag particles. Therefore, the die bond layer 16 can effectively absorb thermal stress occurring due to a difference in a thermal expansion coefficient between the substrate 10 and the IC chip 12 during baking of the anode substrate 10.

Baking of the die bond paste in air causes Ag and $TiO_2$ to remain, so that the die bond layer 16 formed may be porous. Porosity of the die bond layer 16 causes it to substantially absorb thermal stress occurring in the layer 16 due to a difference in thermal expansion between the substrate of the IC chip 12 and the substrate 10 made of glass, as compared to the conventional die bond layer made of frit glass or the like. The thermal stress is related to a thickness of the die bond layer 16 and its adhesive area or an area of the die bonding pad 11 exposed from the inside of the bank 15. More particularly, as shown in FIG. 2, the thermal stress is decreased as a thickness of the die bond layer 16 is increased and its adhesive area is decreased. In view of this respect, in the illustrated embodiment, a suitable amount of the die bond paste is poured or transferred to the space defined at the inside of the bank 15 formed to provide the die bond layer 16 of a predetermined height and adhesive area and the IC chip 12 is mounted on the paste, and then baking is carried out. This permits formation of the die bond layer 16 of a desired thickness sufficient to minimize affection of thermal stress and minimizes a variation of a thickness of the die bond layer 16. For example, in the conventional fluorescent display device, the die bond layer is formed into a thickness of 10-20 μm in view of overflowing of the conductive adhesive from between the IC chip and the substrate, however, this causes much thermal stress to occur in the layer during heating. On the contrary, in the illustrated embodiment, the die bond layer 16 may be formed into a thickness of, for example, 40-60 μm sufficient to minimize affection of thermal stress during heating. Also, in the illustrated embodiment, the portion of the wirings 13a and 14 arranged on the region of the substrate 10 between the die bonding pad 11 and the bonding pads 13 is insulatedly covered with the insulating bank 15, so that the wirings may be effectively prevented from contacting with the the die bond layer 16. In addition, the bonding pads 13 are electrically positively separated from the die bond layer 16 through the bank 15, resulting in electrical connection or contact between both being prevented.

Terminals of the IC chip 12 are connected to the bonding pads 13 through wires 17 formed of Al, Au or the like which serve as metal wirings. This results in the IC chip 12 being electrically connected to anode segments of the display section, external lead wires and the like through the wirings 13a led out from the bonding pads 13.

As described above, the illustrated embodiment permits the insulating bank 15 to be formed into suitable configuration and dimensions and the amount of the conductive adhesive poured in the space defined at the inside of the bank to be suitably adjusted, so that the die bond layer 16 may be formed into a thickness sufficient to substantially absorb thermal stress as compared with the prior art. Also, the embodiment minimizes a variation of a thickness of the die bond layer 16.

Also, the illustrated embodiment is so constructed that the insulating bank 15 is provided between the die bonding pad 11 and the bonding pads 13. Such construction allows arrangement of the wirings between both bonding pads, to thereby realize arrangement of the wirings at high density near the IC chip 12.

In the prior art, the die bond layer entirely covers the die bonding pad when the IC chip is positioned, resulting in positioning of the IC chip with respect to the die bonding pad being inaccurate. On the contrary, in the illustrated embodiment, the die bonding pad 11 covers not the whole die bonding pad 11 but only a part thereof or its outer periphery. Also, as described above, the illustrated embodiment minimizes a variation in a thickness of the die bond layer 16, to thereby render a position of height of the IC chip 12 with respect to a surface of the substrate 10 substantially constant. Accordingly, it will be noted that the embodiment accomplishes positioning of the IC chip 12 with respect to the die bonding pad 11 and wire bonding between the IC chip 12 and the bonding pads 13 with high accuracy.

A configuration of the bank and the like in the embodiment described above are merely illustrative. For example, it is not necessarily required that the insulating bank 15 is formed in a manner to continuously surround the outer periphery of the die bonding pad 11, so long as the bank dams up the conductive adhesive poured in the space defined at the inside of the bank to form the adhesive into a desired thickness. Also, a height of the bank 15 may be larger than or equal to a thickness of the die bond layer. Further, in the illustrated embodiment, the bank 15 is formed in a manner to contact at its inner periphery 15a with the outer periphery of the die bonding pad 11, however, any gap may be provided therebetween.

As can be seen from the foregoing, the present invention is directed to the chip-in-glass type fluorescent display device wherein the insulating bank is provided between the die bonding pad and the bonding pads and the die bond layer arranged at the inside of the bank adhesively bonds the IC chip to the substrate. Such construction of the present invention permits the die bond layer to be formed into a desired and uniform thickness, resulting in minimizing adverse affection of thermal stress occurring during the manufacturing and accurately accomplishing wire bonding operation to lead to an improvement in reliability of the fluorescent display device. Also, it allows the wirings to be arranged at high density on the substrate.

Further, in the present invention, the die bond layer for bonding the IC chip onto the substrate is formed into a matrix structure because it is made by baking a die bond paste mixed with fine conductive particles and an organometallic compound. Accordingly, the die bond layer permits bonding between the Si IC chip and the glass substrate different in a thermal expansion coefficient to be accomplished without causing both to crack.

Furthermore, the organic component contained in the die bond layer is decomposed and volatilized at a temperature below about 420° C. during heating, resulting in the die bond layer formed being made of substantially only an inorganic material which does not discharge destructive decomposition gas.

While a preferred embodiment of the invention has been described with a certain degree of particularity with reference to the drawings, obvious modifications and variations are possible in the light of the above teachings. It is therefore to be understood that within the scope of the appended claims, the invention may be practiced otherwise than as specifically described.

What is claimed is:

1. A fluorescent display device comprising:

a display section for carrying out luminous display including an anode substrate constituting a part of a vacuum envelope in which a high vacuum atmosphere is formed and an anode depositedly formed on said anode substrate; and a circuit section including a semiconductor chip arranged on an end of said anode substrate to drive said display section;

said circuit section comprising a die bonding pad arranged on said anode substrate, bonding pads arranged on a portion of said anode substrate outside said die bonding pad, an insulating bank provided between a periphery of said die bonding pad and said bonding pads, a conductive die bond layer provided at an inside of said bank and fine metal wires for connecting said semiconductor chip and said bonding pads, said semiconductor chip being fixed on said substrate through said die bond layer.

2. A fluorescent display device as defined in claim 1, further comprising wirings extending from said display section to said bonding pads, a part of said wirings being covered with said insulating bank.

3. A fluorescent display device as defined in claim 1, wherein said die bond layer is formed of conductive particles and film-like metal oxide into a matrix structure.

4. A fluorescent display device as defined in claim 1, said anode substrate is made of glass.

5. A fluorescent display device as defined in claim 3, said conductive particles each are formed of a flexible metal material into a flake-like shape.

6. A fluorescent display device as defined in claim 3, said metal oxide is formed by subjecting an organometallic compound to oxidative decomposition.

* * * * *